United States Patent
Lin

(10) Patent No.: US 8,451,949 B2
(45) Date of Patent: May 28, 2013

(54) CLOCK-DATA RECOVERY AND METHOD FOR BINARY SIGNALING USING LOW RESOLUTION ADC

(75) Inventor: Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 741 days.

(21) Appl. No.: 12/574,506

(22) Filed: Oct. 6, 2009

(65) Prior Publication Data

US 2010/0086090 A1   Apr. 8, 2010

Related U.S. Application Data

(60) Provisional application No. 61/103,559, filed on Oct. 7, 2008, provisional application No. 61/105,733, filed on Oct. 15, 2008.

(51) Int. Cl.
*H04L 27/00* (2006.01)
*H04L 27/06* (2006.01)

(52) U.S. Cl.
CPC .................................. *H04L 27/063* (2013.01)
USPC ....................................................... 375/326

(58) Field of Classification Search
CPC .................................................... H04L 27/063
USPC .................. 375/326, 224, 219, 229, 257, 341
See application file for complete search history.

(56) References Cited

U.S. PATENT DOCUMENTS

| | | | |
|---|---|---|---|
| 6,363,111 B1 * | 3/2002 | Hee et al. | 375/224 |
| 7,065,133 B1 * | 6/2006 | Phanse et al. | 375/219 |
| 7,885,154 B2 * | 2/2011 | Yang et al. | 369/47.28 |
| 2004/0172148 A1 * | 9/2004 | Horibe | 700/94 |
| 2006/0045217 A1 * | 3/2006 | Moughabghab et al. | 375/345 |
| 2006/0274861 A1 * | 12/2006 | Langenbach et al. | 375/341 |
| 2006/0280240 A1 * | 12/2006 | Kikugawa et al. | 375/229 |
| 2007/0109053 A1 * | 5/2007 | Langenbach et al. | 330/279 |
| 2007/0140081 A1 * | 6/2007 | Yang et al. | 369/47.28 |
| 2008/0298475 A1 * | 12/2008 | Huang | 375/257 |

OTHER PUBLICATIONS

Liao et al, "A 40Gb/s CMOS Serial-Link Receiver with Adaptive Equalization and CDR", 2008 IEEE intl. Solid-State Circuits Conf. Digest of Tech. Papers, vol. 51, pp. 100-101.

* cited by examiner

*Primary Examiner* — Jaison Joseph
(74) *Attorney, Agent, or Firm* — McClure, Qualey & Rodack, LLP

(57) ABSTRACT

A binary signal detection based on low resolution ADC includes: a variable-gain amplifier for amplifying an input signal with a gain factor controlled by a gain setting to generate an amplified signal; an ADC for converting the amplified signal into a converter output in accordance with a timing provided by a recovered clock, wherein the converter output has N levels; a timing detection circuit for generating a timing error signal based on the converter output; a filter for filtering the timing error signal to generate a control signal; a controllable oscillator for generating the recovered clock under a control of the control voltage; an automatic gain control for processing the converter data to set the gain setting to control the gain factor; and a data recovery circuit for generate a recovered data based on the converter output.

20 Claims, 7 Drawing Sheets

CLOCK-DATA RECOVERY AND METHOD FOR BINARY SIGNALING USING LOW RESOLUTION ADC

CROSS REFERENCE TO RELATED APPLICATIONS

This application claims the benefit of U.S. Provisional Application No. 61/103,559, filed on Oct. 7, 2008 and entitled "CLOCK-DATA RECOVERY FOR BINARY SIGNALING USING TWO-BIT ADC", and the benefit of U.S. Provisional Application No. 61/105,733, filed on Oct. 15, 2008 and entitled "BINARY SIGNAL DETECTION BASED ON THREE-BIT ADC", these contents of which are incorporated herein by reference.

BACKGROUND OF THE INVENTION

1. Field of the Invention

The present invention relates to signal detection, in particular to signal detection for binary signal based on a low resolution analog-to-digital conversion and a logical operation on an output of the conversion.

2. Description of Related Art

Binary signaling is a popular scheme widely used in serial data link; for instance, SATA (Serial Advanced Technology Attachment). In such a serial data link, a bit stream is transmitted at a certain nominal rate $f_s$ in accordance with a first clock signal; each bit is either a logical "1" or a logical "0"; a logical "1" is represented by a voltage of a first level of a certain nominal duration $T_s$, where $T_s=1/f$, while a logical "0" is represented by a voltage of a second level of the certain duration $T_s$; and as a result, the bit stream is represented by a voltage signal toggling back and forth between the first level and the second level in accordance with a pattern of the bit stream. The voltage signal is received by a receiver, which needs to produce a second clock signal (often referred to as the recovered clock signal) that tracks the first clock signal and detecting the bit stream by sampling the voltage signal in accordance with the recovered clock signal.

FIG. 1A shows an exemplary received signal waveform, as observed on an oscilloscope, of a binary signaling system. Such a waveform is referred to as an "eye diagram." In a prior art receiver, a binary phase detector, also known as binary phase detector, is used for adjusting a timing of the recovered clock. The principle of binary phase detector is well known in prior art and thus not described in details here. In a clock-data recovery (CDR) circuit based on using a binary phase detector, the timing of the recovered clock is adjusted in a closed loop manner so as to align a falling edge of the recovered clock with a bit transition (102, 104). If the eye diagram is symmetrical, as in the case of FIG. 1A, then the rising edge of the recovered clock will be aligned with the timing of "maximum eye opening" (101, 103, 105) as long as the falling edge of the recovered clock is aligned with the timing of the bit transition (102, 104), provided the recovered clock has 50% duty cycle. If the eye diagram is not symmetrical, as in the case of FIG. 1B, the timing of the falling edge of the recovered clock will still be aligned with the bit transition (112, 114), but the timing of the rising edge (111, 113, 115) is no longer aligned with the timing of the maximum eye opening (116, 117, 118), provided the recovered clock has 50% duty cycle. In this case, the clock-data recovery circuit fails to sample the received signal at the optimum sampling instant (which is the timing of the maximum eye opening).

This present invention seeks to further improve the performance in data recovery by mitigating a detrimental effect of ISI (inter-symbol interference) due to channel dispersion. An exemplary eye diagram of a received signal suffering from ISI due to channel dispersion is shown in FIG. 1C. Although the eye is still open, i.e. the two levels for the binary signaling are still distinguishable at an optimum sampling instant (121, 123), the eye opening is small and the receiver is prone to making an erroneous decision in presence of circuit noise or coupled noise. What is needed is a method to make the signal detection more reliable.

BRIEF SUMMARY OF THIS INVENTION

Therefore it is one of objects of the present invention to provide clock-data recovery (CDR) that can overcome the aforesaid drawback of the prior art.

According to an aspect of the present invention, a clock-data recovery (CDR) circuit for binary signaling, the clock-data recovery circuit comprising: a variable-gain amplifier (VGA) for amplifying an input signal with a gain factor controlled by a gain setting to generate an amplified signal; an analog-digital converter (ADC) for converting the amplified signal into a converter output in accordance with a timing provided by a recovered clock, wherein the converter output has N levels; a timing detection circuit for processing the converter data to generate a timing error signal; a filter for filtering the timing error signal to generate a control signal; a controllable oscillator for generating the recovered clock under a control of the control voltage; an automatic gain control (AGC) for processing the converter data to set the gain setting to control the gain factor of the VGA; and a data recovery for generate a recovered data based on the converter output.

According to an aspect of the present invention, a method of clock-data recovery for binary signaling, the method comprising: amplifying an input signal with a gain factor controlled by a gain setting to generate an amplified signal; quantizing the amplified signal into a converter output in accordance with a timing provided by a recovered clock, wherein the converter output has N levels; processing the converter data to generate a timing error signal; filtering the timing error signal to generate a control signal; controlling a timing of the recovered clock in accordance with the control signal; controlling the gain setting by processing the converter data; and generating a recovered data based on the converter output.

These and other objectives of the present invention will no doubt become obvious to those of ordinary skill in the art after reading the following detailed description of the preferred embodiment that is illustrated in the various figures and drawings.

DETAILED DESCRIPTION OF THIS INVENTION

The present invention relates to clock-data recovery. While the specifications described several example embodiments of the invention considered best modes of practicing the invention, it should be understood that the invention can be implemented in many way and is not limited to the particular examples described below or to the particular manner in which any features of such examples are implemented. In other instances, well-known details are not shown or described to avoid obscuring aspects of the invention.

Figure 1A:
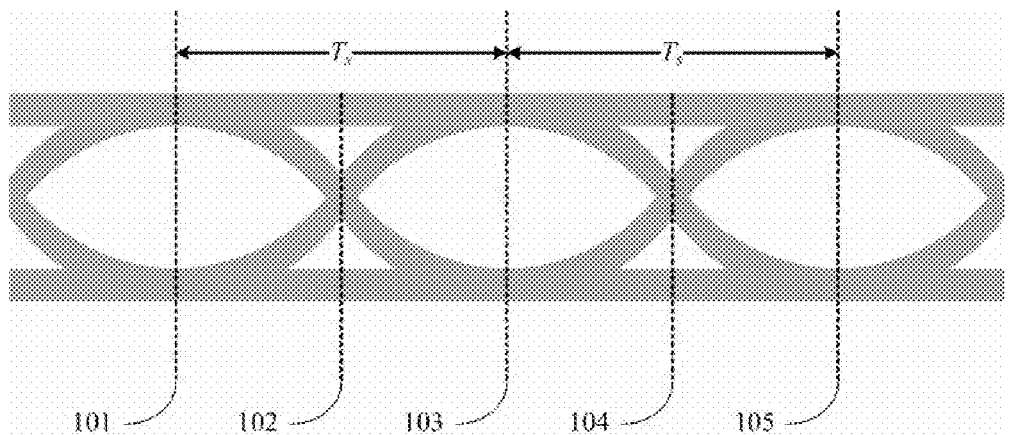
FIG. 1A shows a symmetrical eye diagram of a received signal in a binary signaling system.
Figure 1B:
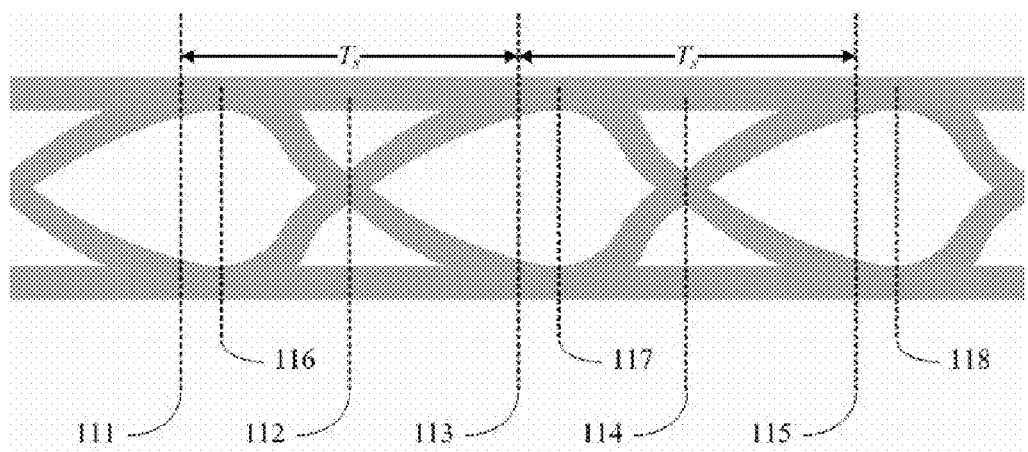
FIG. 1B shows an unsymmetrical eye diagram of a received signal in a binary signaling system.
Figure 1C:
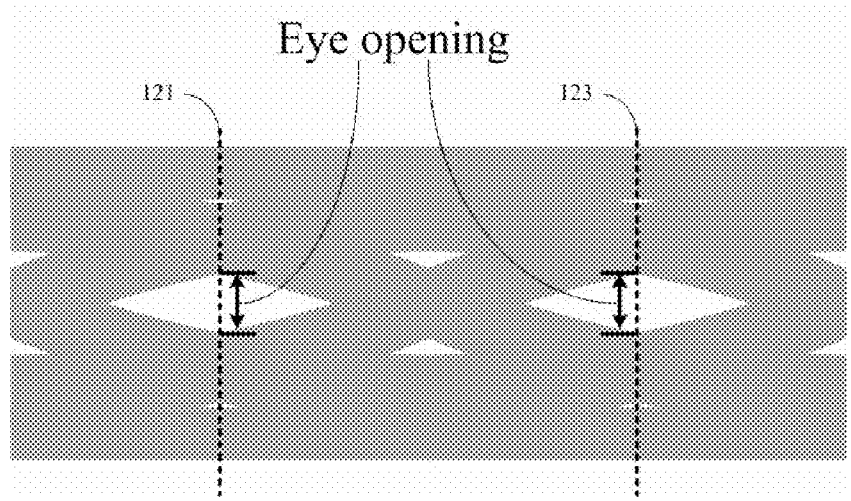
FIG. 1C shows an eye diagram of a received signal in a binary signaling system suffering from inter-symbol interference.
Figure 2:
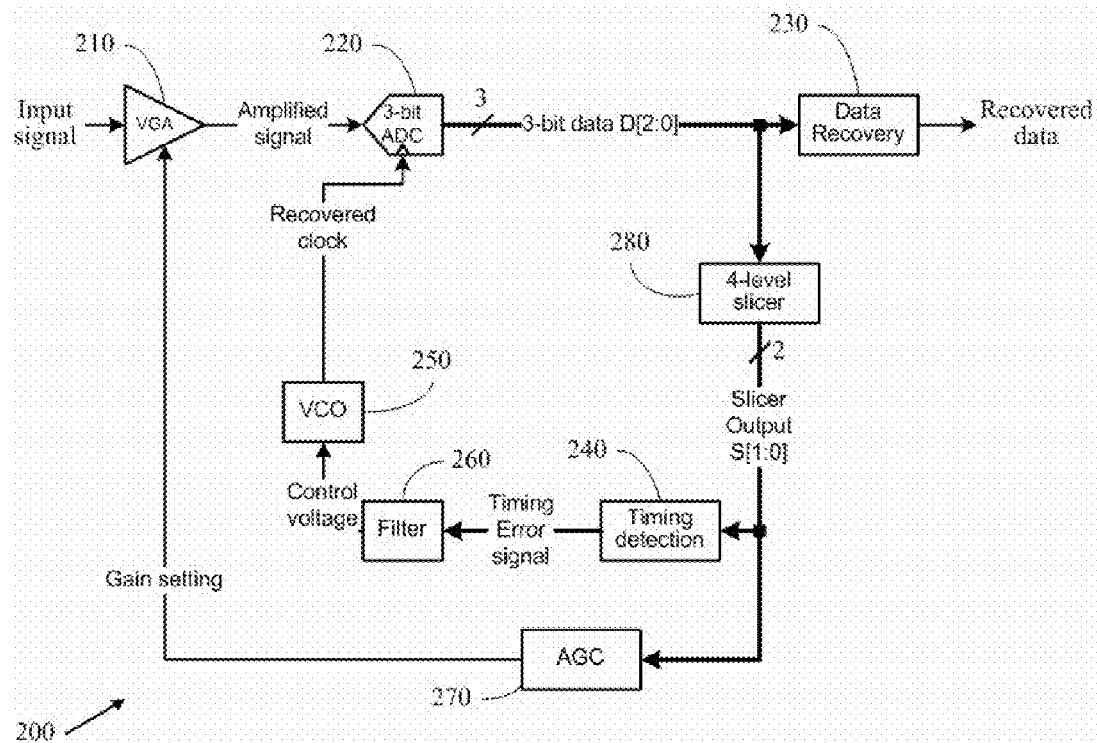
FIG. 2 shows an embodiment of a functional block diagram of a clock-data recovery circuit in accordance with the present invention.

FIG. 2 depicts a functional block diagram of an embodiment 200 of a clock-data recovery (CDR) circuit in accordance with the present invention. CDR circuit 200 comprises: a variable-gain amplifier (VGA) 210 for amplifying an input signal with a gain factor controlled by a gain setting to generate an amplified signal; a low-resolution ADC (analog-digital converter) 220 for converting the amplified signal into 3-bit data D[2:0] in accordance with a timing provided by a recovered clock; a 4-level slicer 280 for slicing the 3-bit data D[2:0] into a 2-bit slicer output data S[1:0]; a timing detection circuit 240 for processing the 2-bit slicer output data S[1:0] to generate a timing error signal; a filter 260 for filtering the timing error signal to generate a control voltage; a VCO (voltage controlled oscillator) 250 for generating the recovered clock under a control of the control voltage; an AGC (automatic gain control) block 270 for processing the 2-bit slicer output data S[1:0] to generate the gain setting to control the gain factor of the VGA 210; and a data recovery circuit 230 for generating a recovered data based on the 3-bit data D[2:0]. In an embodiment, the low-resolution ADC 220 can be a 3-bit ADC. Of course, the low-resolution ADC 220 can be a 2-bit ADC, a 4-bit ADC, or a 5-bit ADC.

The 3-bit ADC 220 quantizes the amplified signal into 8 levels with a level spacing of VREF/3; the 8 levels are: $-7/6 \cdot$VREF, $-5/6 \cdot$VREF, $-3/6 \cdot$VREF, $-1/6 \cdot$VREF, $1/6 \cdot$VREF, $3/6 \cdot$VREF, $5/6 \cdot$VREF, and $7/6 \cdot$VREF, corresponding to the 3-bit data (D[2:0]) values of 000, 001, 010, 011, 100, 101, 110, and 111, respectively. Here, VREF is a reference voltage level to be chosen at the discretion of circuit designer. In a typical embodiment, VREF ranges between 0.5V and 2V. In an embodiment, the 3-bit quantization is performed in accordance with a mapping scheme illustrated in Table 1. In an embodiment, the low-resolution ADC 220 has M levels, where M includes one of the following: 6, 10, 12, 14, and 16.

TABLE 1

| Amplified signal level | 3-bit Data D[2:0] | Quantized level |
|---|---|---|
| Above VREF | 111 | $7/6 \cdot$ VREF |
| Between $2/3 \cdot$ VREF and VREF | 110 | $5/6 \cdot$ VREF |
| Between $1/3 \cdot$ VREF and $2/3 \cdot$ VREF | 101 | $3/6 \cdot$ VREF |
| Between 0 V and $1/3 \cdot$ VREF | 100 | $1/6 \cdot$ VREF |
| Between $-1/3 \cdot$ VREF and 0 V | 011 | $-1/6 \cdot$ VREF |
| Between $-2/3 \cdot$ VREF and $-1/3 \cdot$ VREF | 010 | $-3/6 \cdot$ VREF |
| Between $-$VREF and $-2/3 \cdot$ VREF | 001 | $-5/6 \cdot$ VREF |
| Below $-$VREF | 000 | $-7/6 \cdot$ VREF |

Note that in a preferred embodiment VGA 210 and ADC 220 are implemented in a differential circuit topology comprising a positive end and a negative end so that the signal level and the quantized level is said to be positive (negative) when the value in the positive end is higher (lower) than that in the negative end. In any case, the notion of positive/negative is always stated in a relative sense (either between two ends, or between one end and a reference level).

In an embodiment, the 4-level slicer 280 slices the 3-bit data D[2:0] into 4 levels: $-3/2 \cdot$VREF, $-1/2 \cdot$VREF, $1/2 \cdot$VREF, and $3/2 \cdot$VREF, corresponding to the 2-bit slicer output data (S[1:0]) values of 00, 01, 10, and 11, respectively, in accordance with the following table:

TABLE 2

| 3-bit Data D[2:0] | 2-bit Slicer Output Data S[1:0] | Quantized level |
|---|---|---|
| 111 | 11 | $3/2 \cdot$ VREF |
| 110 | 10 | $1/2 \cdot$ VREF |
| 101 | 10 | $1/2 \cdot$ VREF |
| 100 | 10 | $1/2 \cdot$ VREF |
| 011 | 01 | $-1/2 \cdot$ VREF |
| 010 | 01 | $-1/2 \cdot$ VREF |
| 001 | 01 | $-1/2 \cdot$ VREF |
| 000 | 00 | $-3/2 \cdot$ VREF |

In accordance with an embodiment of the present invention, the gain factor of VGA 210 is adjusted in a closed loop manner so that the 2-bit slicer output data S[1:0] is equally likely to be 10 or 11 when the amplified signal is positive (i.e. above 0V), and equally likely to be 00 or 01 when the amplified signal is negative (i.e. below 0V). In other words, when the amplified signal level is positive, it is equally likely to be above or below VREF; when the amplified signal level is negative, it is equally likely to be above or below VREF. In an embodiment, the gain factor of VGA 210 is adjusted by the AGC block 270 based on the 2-bit data S[1:0] in accordance with a mapping scheme illustrated in Table 3.

TABLE 3

| 2-bit slicer output data S[1:0] | Adjustment in the gain factor |
|---|---|
| 11 | Decrease |
| 10 | Increase |
| 01 | Increase |
| 00 | Decrease |

When the 2-bit data S[1:0] is either 00 or 11, the absolute value of the amplified signal level is greater than VREF; the gain factor is apparently too large and needs to be decreased. When the 2-bit data S[1:0] is either 01 or 10, the absolute value of the amplified signal level is less than VREF; the gain factor is apparently too small and needs to be increased. To make the gain adjustment smooth, the amount of incremental change of the gain factor, for either increase or decrease, needs to be moderate. In an embodiment, the amount of incremental change of the gain factor is no more than 5%.

In an embodiment, AGC block 270 doesn't directly apply Table 3 to adjust the gain factor, but instead applies Table 3 to first acquire a sequence of tentative decisions, which are either 1 (for favoring an increase to the gain factor) or −1 (for favoring a decrease to the gain factor), and then filters or processes the tentative decisions to reach a conclusive decision to either increase or decrease the gain factor. In an embodiment, AGC block 270 reaches the conclusive decision based on a majority vote of a block of tentative decisions. By way of example but not limitation, after applying Table 3 to a block of one hundred samples of the 2-bit slicer output data S[1:0] to acquire one hundred tentative decisions of either 1 or −1, AGC block 270 will decide to increase the gain factor if there are more than fifty 1's to decrease the gain factor if there are less than fifty 1's and to keep the gain factor unchanged if there are exactly fifty 1's. In an alternative embodiment, AGC block 270 reaches the conclusive decision based on a "landslide" majority vote of a block of tentative decisions. By way of example but not limitation, after applying Table 3 to a block of one hundred samples of the 2-bit slicer output data S[1:0] to acquire one hundred tentative decisions of either 1 or −1, AGC block 270 will decide to increase the gain factor if there are more than fifty-five 1's to decrease the gain factor if there are more than fifth-five −1's, and to keep the gain factor unchanged otherwise. That is, the gain factor is to be adjusted only when there are an overwhelming majority of tentative decisions to suggest a need to either increase or decrease the gain factor (fifty-five percentage is considered an overwhelming majority by way of example but not limitation).

In an embodiment, the function of the gain adjustment of AGC 270 can be conditionally disabled (to keep the gain unchanged regardless of the 2-bit slicer output data S[1:0]). In an embodiment, the gain adjustment is enabled during a system startup. In an embodiment, the gain adjustment is enabled continually (even though the gain can be updated only once for a certain block of the 2-bit slicer output data S[1:0]). In an embodiment, the gain adjustment is enabled intermittently. In an embodiment, the amount of incremental change of the gain factor can be dynamically adjusted. In an embodiment, the amount of incremental change of the gain factor is initially set to a first value and then reduced to a second value that is smaller than the first value; this allows a faster gain adaptation in the initial acquisition phase, and a smoother gain adaptation in the steady state tracking phase.

Figure 3A:
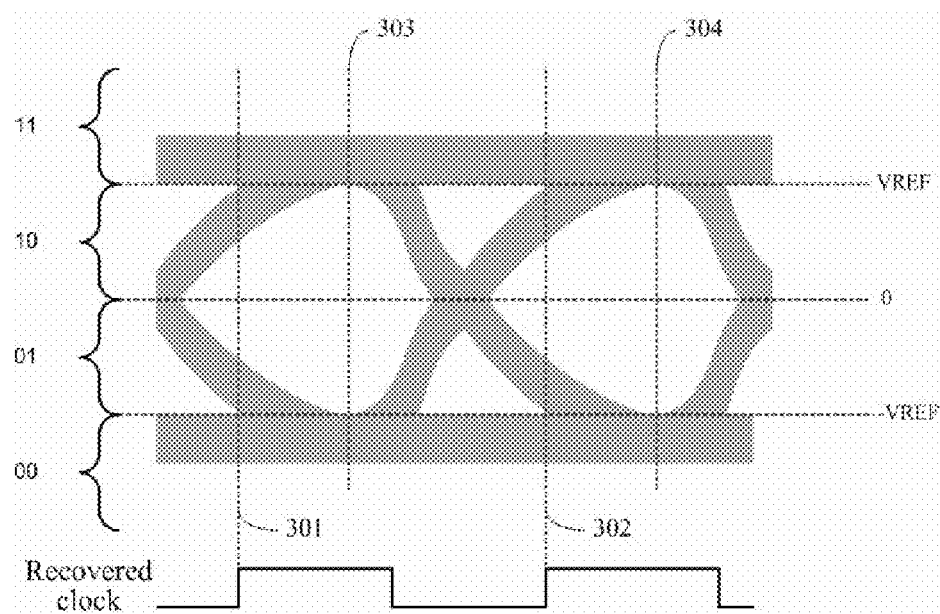
FIG. 3A shows a timing diagram of a clock-data recovery circuit where a gain factor is properly adjusted but the recovered clock is too early.
Figure 3B:
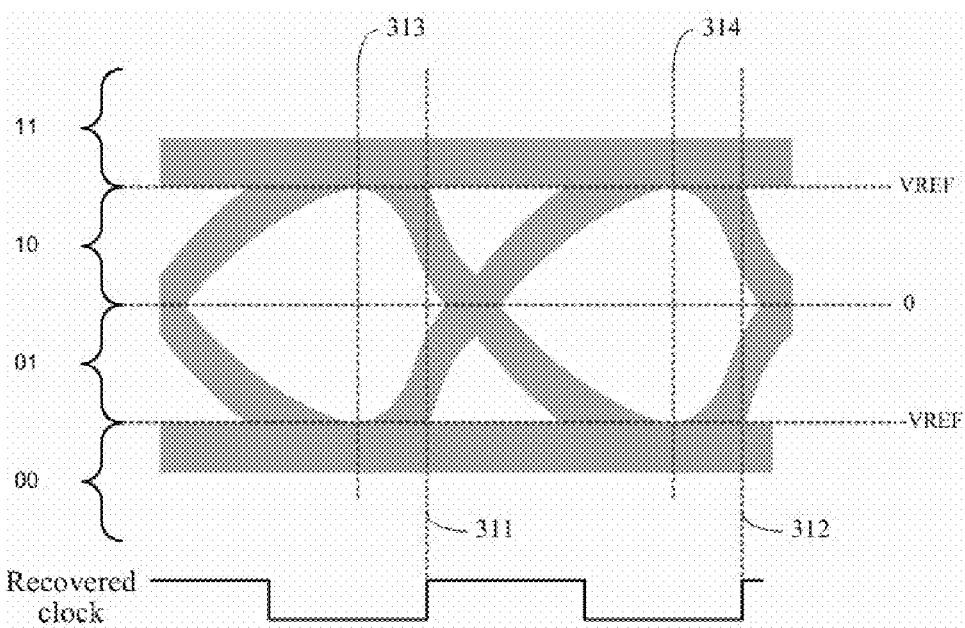
FIG. 3B shows a timing diagram of a clock-data recovery circuit where the gain factor is properly adjusted but the recovered clock is too late.

Once the gain of the VGA 210 is properly adjusted, the amplified signal level is equally likely to be above or below VREF when it is positive, and equally likely to be above or below −VREF when it is negative. Then, by observing two consecutive samples of the 2-bit slicer output data S[1:0], one can extract a timing relationship between the amplified signal and the recovered clock. FIG. 3A depicts an exemplary eye diagram for a case where the AGC is properly set but the timing of the recovered clock (rising edges 301, 302) is earlier than the optimum sampling instant (303, 304). FIG. 3B depicts an exemplary eye diagram for a case where the AGC is properly set but the timing of the recovered clock (rising edges 311, 312) is later than the optimum sampling instant (313, 314). A first analog-to-digital conversion by ADC 220 and then slicing by slicer 280 taken at a first sampling instant (301 in FIG. 3A, and 311 in FIG. 3B) yields a first sample of the 2-bit slicer output data S[1:0], while a second analog-to-digital conversion by ADC 220 and then slicing by slicer 280 taken at the next sampling instant (302 in FIG. 3A, and 312 in FIG. 3B) yields a second sample of the 2-bit slicer output data S[1:0]. Each 2-bit sample has four possible values: 00, 01, 10, and 11. If there is no correlation between the first 2-bit sample and the second 2-bit sample, then there are totally sixteen (i.e. four times four) possible combinations between the two 2-bit samples. However, there is a correlation and therefore only a portion of the combinations are allowed, as listed in Table 4.

TABLE 4

| Possible combinations for the two consecutive 2-bit samples when the recovered clock is too early | Possible combinations for the two consecutive 2-bit samples when the recovered clock is too late |
|---|---|
| {00, 00} | {00, 00} |
| {00, 10} | {00, 01} |
| {01, 00} | {01, 10} |
| {01, 10} | {01, 11} |
| {10, 01} | {10, 00} |
| {10, 11} | {10, 01} |
| {11, 01} | {11, 10} |
| {11, 11} | {11, 11} |

Figure 4:
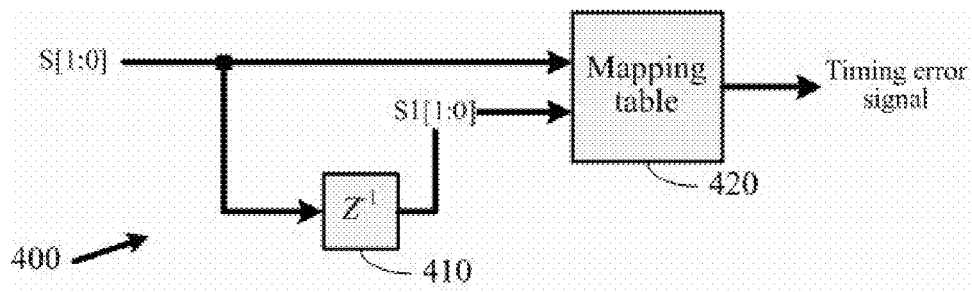
FIG. 4 shows a functional block diagram of a timing error detection circuit in accordance with the present invention.

By carefully examining Table 4, one finds that the following four combinations suggests the recovered clock is too early and needs to slow down: {00, 10}, {01, 00}, {10, 11}, and {11, 01}, and the following four combinations suggests the recovered clock is too late and needs to speed up: {00, 01}, {01, 11}, {10, 00}, and {11, 10}. Based on this observation, an embodiment 400 of the timing detection block 240 of FIG. 2 is shown in FIG. 4. Embodiment 400 comprises: a unit delay element 410 for receiving and storing a present 2-bit slicer output data sample S[1:0] and outputting a previous 2-bit slicer output data sample S1[1:0], and a mapping table 420 for mapping a combination of the present 2-bit slicer output data sample S[1:0] and the previous 2-bit slicer output data sample S1[1:0] into a timing error signal, which is a ternary signal having three possible values: −1, 0, and 1, in accordance with the following algorithm:

---
Algorithm 1
---
If (S1[1:0]=00 AND S[1:0]=10), OR (S1[1:0]=01 AND S[1:0]=00), OR (S1[1:0]=10 AND S[1:0]=11), OR (S1[1:0]=11 AND S[1:0]=01), set the timing error signal to −1,
Else if (S1[1:0]=00 AND S[1:0]=01), OR (S1[1:0]=01 AND S[1:0]=11), OR (S1[1:0]=10 AND S[1:0]=00), OR (S1[1:0]=11 AND S[1:0]=10), set the timing error signal to 1,
Else set the timing error signal to 0.

---

When the timing error signal is −1 (1), it indicates the recovered clock is too early (late) and needs to speed up (slow down). When the timing error signal is 0, it indicates either the clock timing is right and thus no change is needed or no sufficient timing information can be drawn to warrant a change.

Now refer back to FIG. 2. The filter 260 receives the timing error signal and outputs the control voltage. In an embodiment, the timing error signal, which is a ternary signal having three possible values: −1, 0, and 1, is first converted into a current-mode signal by a charge pump circuit; the current-mode signal is negative (i.e. the charge pump is draining charge) when the timing error signal is −1, positive (i.e. the charge pump is sourcing charge) when the timing error signal is 1, and zero (i.e. the charge pump is neither draining nor sourcing charge) when the timing error signal is 0. An embodiment of a charge pump circuit is well known in prior art and thus not described in detail here. In a further embodiment, the current-mode signal is filtered by a circuit comprising a combination of at least a resistor and a capacitor. In a preferred embodiment, the circuit comprises a parallel connection of a capacitor and a series resistor-capacitor network.

An embodiment for a voltage controlled oscillator for VCO 250 is well known in prior art and thus not described in detail here. Although a VCO is used here, any alternative controllable oscillator circuit whose oscillating frequency can be controlled by a control signal can be used.

An embodiment for a 3-bit analog-to-digital converter is well known in prior art and thus not described in detail here. In a preferred embodiment, the 3-bit ADC 220 comprises seven comparators for comparing the amplified signal with −VREF, −2/3·VREF, −1/3·VREF, 0V, 1/3·VREF, 2/3·VREF, and VREF, respectively, where VREF, as described earlier, is a reference voltage level, where in a steady state of automatic gain control the absolute value of the amplified signal is equally likely to be above or below the reference voltage level.

An embodiment for a variable gain amplifier like VGA 210 in FIG. 2 is well known in prior art and thus not described in detail here. In general, an amplifier has a gain factor determined by a bias current and a load circuit. In an embodiment, a variable gain amplifier comprises a configurable bias current that is configured by the gain setting; in this case, the automatic gain control block (AGC 270 in FIG. 2) will increase/decrease the bias current when it seeks to increase/decrease the gain factor. In another embodiment, a variable gain amplifier comprises a configurable load circuit that is configured by the gain setting; in this case, the automatic gain control block (AGC 270 in FIG. 2) will increase/decrease an impedance of the load circuit when it seeks to increase/decrease the gain factor.

Figure 5A:
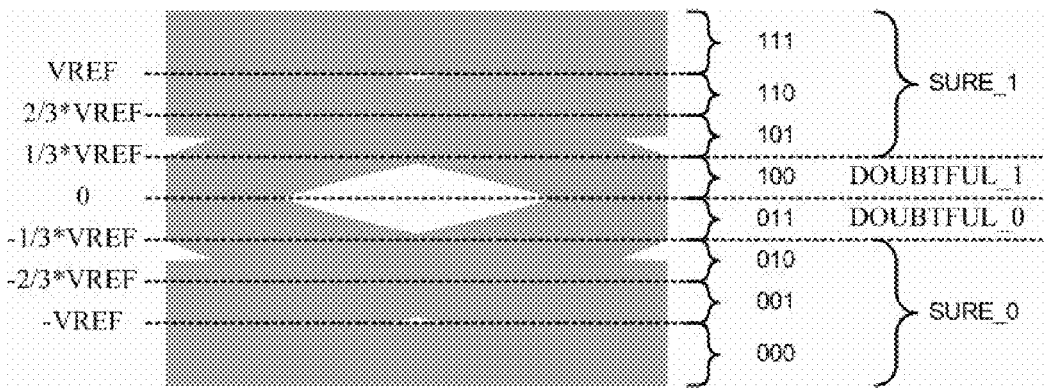
FIG. 5A shows a slicing of a received signal into four regions.

Still refer to FIG. 2. The data recovery circuit 230 generates the recovered data based on the 3-bit data D[2:0]. In absence of ISI (inter-symbol interference), the amplified signal should be very close to either VREF (when the correct data bit is "1") or −VREF (when the correct data bit is "0") after the AGC loop settles. In other words, the 3-bit data D[2:0] should be 111 or 110 when the correct data bit is "1," and 000 or 001 when the correct data bit is "0." With a mild ISI from a preceding bit of an opposite logical value, the 3-bit data D[2:0] may drift to 101 when the correct data bit is "1" and drift to 010 when the correct data bit is "0." With a significant but not severe ISI from one or two preceding bits of an opposite logical value, the 3-bit data D[2:0] may even drift to 011 when the correct data bit is "1" and drift to 100 when the correct data bit is "0." In an embodiment suitable for a system where the ISI can be significant but not too severe so that the 3-bit data D[2:0] is no lower than 011 when the correct data bit is "1" and no higher than 100 when the correct data bit is "0," the 3-bit data D[2:0] is sliced into four regions: (1) SURE_1, where the correct data bit should be "1" for sure (2) SURE_0, where the correct data should be "0" for sure, (3) DOUBTFUL_1, where the correct data bit might be "1" but it is doubtful, and (4) DOUBTFUL_0, where the correct data bit might be "0" but it is doubtful. In an embodiment illustrated in FIG. 5A, the recovered data is considered a sure "1" when the 3-bit data D[2:0] is among {101, 110, 111}, which defines the SURE_1 region; the recovered data is considered a sure "0" when the 3-bit data D[2:0] is among {000, 001, 010}, which defines SURE_0 region; the recovered data is considered a doubtful "1" when the 3-bit data D[2:0] is 100, which defines the DOUBTFUL_1 region; and the recovered data is considered a doubtful "0" when the 3-bit data D[2:0] is 011, which defines the DOUBTFUL_0 region. In an embodiment where the dominant contribution of ISI is from a first preceding data bit and the ISI is mild, the following algorithm is used for the data recovery circuit 230 to generate the recovered data based on the 3-bit data D[2:0]:

---

Algorithm 2

---

If the 3-bit data D[2:0] is in the SURE_1 region (i.e. among {101, 110, 111}), set the recovered data to 1,
Else if the 3-bit data D[2:0] is in the SURE_0 region (i.e. among {000, 001, 010}), set the recovered data to 0,
Else if the 3-bit data D[2:0] is in the DOUBTFUL_1 region (100) and the previous recovered data is 1, set the recovered data to 0,
Else if the 3-bit data D[2:0] is in the DOUBTFUL_1 region (100) and the previous recovered data is 0, set the recovered data to 1,
Else if the 3-bit data D[2:0] is in the DOUBTFUL_0 region (011) and the previous recovered data is 1, set the recovered data to 0,
Else set the recovered data to 1.

Here, the previous recovered data refers to a unit-cycle-delay of the recovered data obtained using a unit-cycle-delay circuit clocked by the recovered clock.

In an alternative embodiment suitable for a system where the ISI is more severe so that the 3-bit data D[2:0] can only guaranteed to be no lower than 010 when the correct data bit is "1" and no higher than 101 when the correct data bit is "0," the 3-bit data D[2:0] is sliced into six regions: (1) SURE_1, where the correct data bit should be "1" for sure (2) SURE_0, where the correct data should be "0" for sure, (3) PROBABLE_1, where the correct data is probably but not surely 1, (4) PROBABLE_0, where the correct data is probably but not surely 0, (5) DOUBTFUL_1, where the correct data bit might be "1" but it is doubtful, and (6) DOUBTFUL_0, where the correct data bit might be "0" but it is doubtful. In an embodiment illustrated in FIG. 5B, the recovered data is considered a sure "1" when the 3-bit data D[2:0] is among {110, 111}, which defines the SURE_1 region; the recovered data is considered a sure "0" when the 3-bit data D[2:0] is among {000, 001}, which defines the SURE_0 region; the recovered data is considered a probable 1 when the 3-bit data is 101, which defines the PROBABLE_1 region; the recovered data is considered a probable 0 when the 3-bit data is 010, which defines the PROBABLE_0 region; the recovered data is considered a doubtful "1" when the 3-bit data D[2:0] is 100, which defines the DOUBTFUL_1 region; and the recovered data is considered a doubtful "0" when the 3-bit data D[2:0] is 011, which defines the DOUBTFUL_0 region. Also, a union of SURE_1 and SURE_0 is defined as the SURE region ({000, 001, 110, 111}); a union of PROBABLE_1 and PROBABLE_0 is defined as the PROBABLE region ({010, 101}); a union of DOUBTFUL_1 and DOUBTFUL_0 is defined as the DOUBTFUL region ({011, 100}); a union of SURE_1, PROBABLE_1, and DOUBTFUL_1 is defined as the ONE region ({100, 101, 110, 111}); and a union of SURE_0, PROBABLE_0, and DOUBTFUL_0 is defined as the ZERO region ({000, 001, 010, 011}). In an embodiment where the dominant contribution of ISI is from a first preceding data bit and a second preceding data bit and the first preceding data bit causes a more significant interference than the second preceding data bit, the following algorithm is used for the data recovery circuit 230 to generate the recovered data based on a current value of the 3-bit data D[2:0] and its previous value D1[2:0]:

Algorithm 3

If D[2:0] is in the SURE region (i.e. among {000, 001, 110, 111}), set the recovered data to D[2],
Else if D[2] is not equal to D1[2], set the recovered data to D[2],
Else if D[2:0] is in the PROBABLE region and D1[2:0] is in the SURE region, set the recovered data to an logical inversion of D[2],
Else if D[2:0] is in the PROBABLE region and D1[2:0] is in the DOUBTFUL region, set the recovered data to D[2],
Else if D[2:0] is in the PROBABLE region and D1[2:0] is also in the PROBABLE region, set the recovered data to the logical inversion of the previous recovered data,
Else if D[2:0] is in the DOUBTFUL region and D1[2:0] is not in the DOUBTFUL region, set the recovered data to an logical inversion of D[2],
Else set the recovered data to the logical inversion of the previous recovered data.

Here, the previous value D1[2:0] is a unit-cycle-delay of D[2:0] obtained using a unit-cycle-delay circuit clocked by the recovered clock, and the previous recovered data is a unit-cycle delay of the recovered data using a unit-cycle-delay circuit clocked by the recovered clock.

The principle behind algorithm 2 is explained as follows. If the sample magnitude of interest is large (i.e. among {000, 001, 110, 111}), the recovered data of interest is most likely the same as the polarity of the sample of interest. Otherwise, if there is a sign change from the preceding sample, the recovered data of interest is most likely the same as the polarity of the sample of interest. Otherwise, if the sample magnitude is decreasing into the PROBABLE region, the recovered data of interest is most likely 0. Otherwise, if the sample magnitude is increasing into the PROBABLE region, the recovered data of interest is most likely 1. Otherwise, if the sample magnitude of interest stays in the PROBABLE region, the recovered data of interest is most likely a logical inversion of the preceding recovered data. Otherwise, if the sample magnitude of interest is decreasing into the DOUBTFUL region, the recovered data of interest is most likely a logical inversion of the polarity of the sample of interest. Otherwise, the recovered data of interest is most likely a logical inversion of the preceding recovered data. Note that the preceding recovered data is obtained from a unit cycle delay of the recovered data.

In an embodiment in a general sense, the data recovery circuit 230 generates a current value of the recovered data in accordance with a logical relationship based on a current value of the 3-bit data D[2:0] and at least one of its previous value D1[2:0] and a previous value of the recovered data. The logical relationship is defined in accordance with the ISI characteristics of the received signal.

Figure 6A:
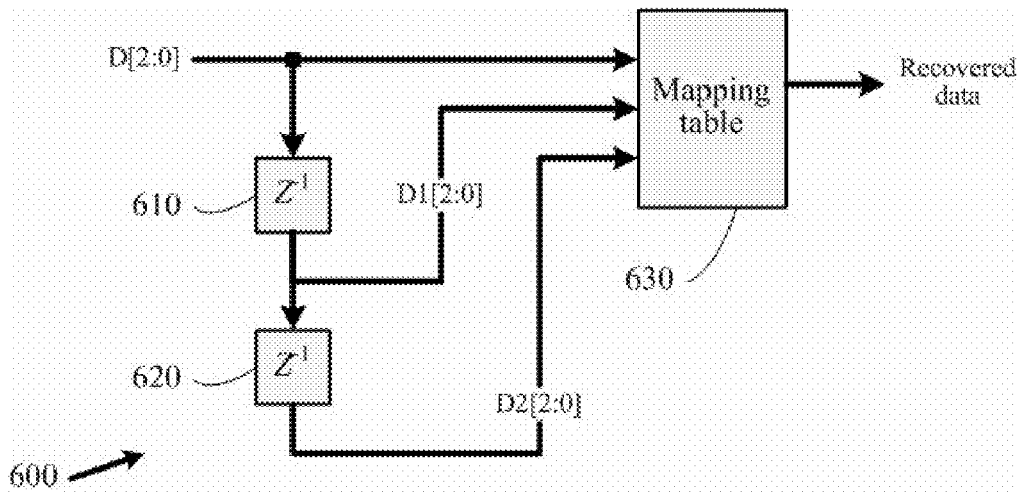
FIG. 6A shows a functional block diagram of a data recovery circuit for the clock-data recovery circuit of FIG. 2.

In a further embodiment 600 depicted in FIG. 6A suitable for implementing the data recovery circuit 230 of FIG. 2 to handle an even more severe ISI, one generates a value of the recovered data in accordance with a logical relationship based on a current value of the 3-bit data D[2:0] and its two preceding values D1[2:0] and D2[2:0]. Embodiment 600 comprises a first unit-delay circuit 610, a second unit-delay circuit 620, and a mapping table 630. The first unit-delay circuit 610 receives the current value of the 3-bit data D[2:0] and outputs accordingly the first preceding value D1[2:0], while the second unit-delay circuit 620 receives the first preceding value D1[2:0] and outputs accordingly the second preceding value D2[2:0]. The mapping table 630 generates a value of the recovered data based on a logical relationship based on the current value D[2:0] and the two preceding values D1[2:0] and D2[2:0] of the 3-bit data. Here, both the precursor ISI and the post cursor ISI are considered, and therefore the recovered data of interest is actually corresponding to the data embedded in the first preceding value D1[2:0] of the 3-bit data (i.e. the preceding value D1[2:0] is the sample of interest). (When D1[2:0] is the sample of interest, the interference of D2[2:0] on D1[2:0] is referred to as a post-cursor ISI, while the interference of D[2:0] on D1[2:0] is referred to as a precursor ISI.) In an embodiment, the mapping table 630 is based on the following algorithm:

Algorithm 4

Figure 5B:
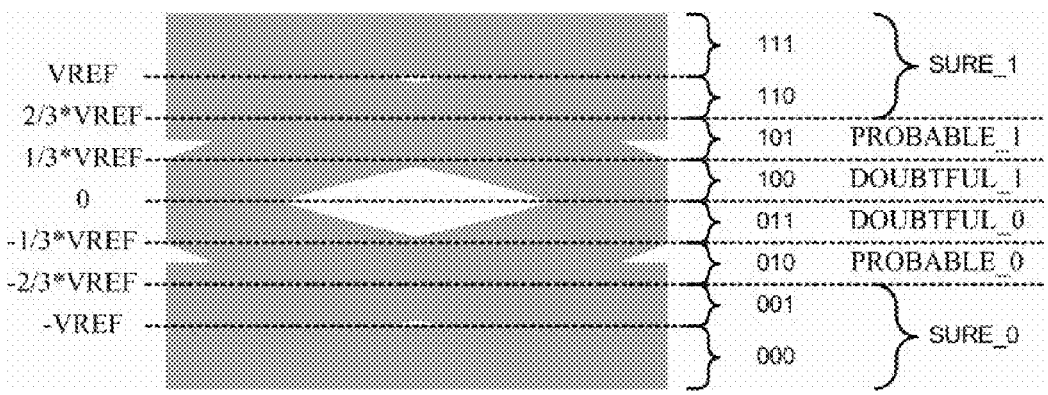
FIG. 5B shows a slicing of a received signal into six regions.

If D1[2:0] is in the SURE region (i.e. among {000, 001, 110, 111}) of FIG. 5B, set the recovered data to D1[2],
Else if D1[2:0] is higher than D2[2:0] by at least two levels, set the recovered data to 1,
Else if D1[2:0] is lower than D2[2:0] by at least two levels, set the recovered data to 0,
Else if D1[2] is different from D2[2], set the recovered data to D1[2],
Else if D1[2:0] is higher than D[2:0], set the recovered data to 1,
Else if D1[2:0] is lower than D[2:0], set the recovered data to 0,
Else set the recovered data to the logical inversion D1[2].

The principle behind algorithm 4 is explained as follows. If the sample magnitude of interest is large (i.e. among {000, 001, 110, 111}), the recovered data of interest is most likely the same as the polarity of the sample of interest. Otherwise, if the sample of interest is a abrupt increase from its preceding sample, the recovered data of interest is most likely 1. Otherwise, if the sample of interest is an abrupt decrease from its preceding sample, the recovered data of interest is most likely 0. Otherwise, if there is a sign change between the sample of interest and its preceding sample, the recovered data of interest is most likely the same as the polarity of the sample of interest. Otherwise, if the sample of interest is higher than its succeeding sample, the recovered data of interest is most likely 1. Otherwise, if the sample of interest is lower than its succeeding sample, the recovered data of interest is most likely 0. Otherwise, the recovered data of interest is most likely a logical inversion of the polarity of the sample of interest.

In an embodiment in a general sense, the data recovery circuit 230 generates a recovered data of interest in accordance with a logical relationship based on a sample of interest (D1[2:0]), its preceding sample (D2[2:0]), and its succeeding sample (D[2:0]). The logical relationship is defined in accordance with the ISI characteristics of the received signal. In general, the recovered data of interest is most likely 1 when the sample of interest is positive and large in magnitude, or abruptly increases from its preceding sample; and the recovered data of interest is most likely 0 when the sample of interest is negative and large in magnitude, or abruptly decreases from its preceding sample. When the sample of interest is neither large in magnitude nor not abruptly changing from its preceding sample, one uses the relative change from the sample of interest to its succeeding sample to detect the recovered data of interest.

Now, refer to FIG. 2. In a further embodiment, a low resolution ADC other than a 3-bit ADC is used. For instance, a 10-level ADC is used instead of the 8-level 3-bit ADC. In this case, the ADC output will be 4-bit (but only 10 values are allowed: {0011, 0100, 0101, 0110, 0111, 1000, 1001, 1010, 1011, 1100}; also, the spacing between two adjacent levels is VREF/4 and the principle of Algorithm 3 is still applicable. The SURE region is defined as {0011, 0100, 1011, 1100}. In a similar manner, a 12-level ADC, a 14-level, or a 16-level can also be used to replace the 3-bit ADC. In any case, the 4-level slicer 280 is based on comparing the sample with the three reference levels: −VREF, 0, and VREF; also, the ADC output includes a plurality of levels, among which only one level is higher than VREF and one level is lower than −VREF, and the SURE region includes the two levels that are closest to VREF and the two levels that are closed to −VREF. In any case, S[1:0]=00 when the sample is below −VREF; S[1:0]=01 when the sample is between −VREF and 0; S[1:0]=10 when the sample is between 0 and VREF; and S[1:0]=11 when the sample is above −VREF. In any case, the principle behind Algorithm 3 can be applied, but the criterion for "abrupt increase/decrease" needs to be adjusted in accordance with the ADC resolution and the ISI characteristics. For instance, when using 12-level ADC, "higher by at least three levels" is considered "abrupt increase," as opposed to "higher by at least two levels" in the case of 3-bit ADC. In general, using more ADC levels lends to better performance in data recovery as it can more precisely handle the inter-symbol interference characteristics; however, this comes at a higher hardware cost and more power consumption.

Still refer to FIG. 2. In an embodiment, the 4-level slicer 280 is removed but its function is preserved and absorbed in the timing detection block 240 and AGC block 270. Those of ordinary skill of art can freely do the functional block partition for their receiver without departing from the scope of the prevent invention as long as the functions disclosed in the present invention are preserved.

Figure 6B:
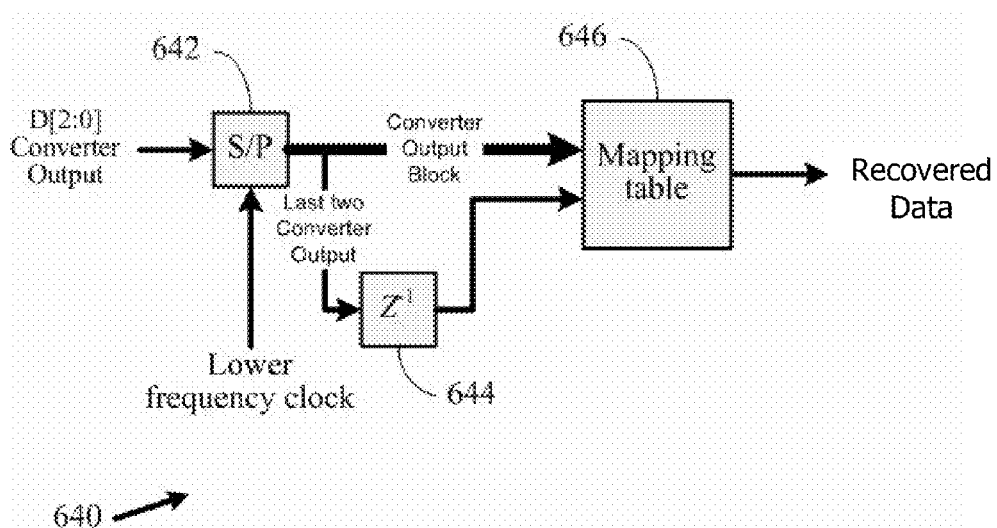
FIG. 6B shows an alternative embodiment of the data recovery circuit suitable for high frequency applications for the clock-data recovery circuit of FIG. 2.

Now refer to FIG. 6A. For a high frequency application, the unit-delay circuits 610 and 620 need to operate at a high clock frequency. For instance, for a 5 Gigabit-per-second link, the unit-delay circuits 610 and 620 need to operate at 5 GHz. A straight implementation using 5 GHz clock may not be easily practical. In this case, one can use a serial-to-parallel conversion to convert the serial 3-bit data D[2:0] into a block of 3-bit data at a lower frequency and perform block signal processing, as shown in embodiment 640 of FIG. 6B. The high frequency clocked 3-bit converter output data D[2:0] is converted into a block of lower frequency clock data by the S/P block 642 using a lower frequency clock. For instance, the serial 3-bit converter output data D[2:0] at 5 GHz can be converted into a block of twenty parallel 3-bit dada at 250 MHz. The method for performing such a serial-to-parallel conversion (S/P block 642) is well known to those of ordinary skill in the art and thus not described in detail here. Since one wants to consider both precursor ISI and post cursor ISI, two extra converter output data are needed. Therefore, a unit-delay circuit 644 is used to store the last two converter data output from the previous block. Note that the unit-delay circuit 644 is operated at the lower frequency (e.g. 250 MHz, instead of 5 GHz). The block of parallel converter data output, along with the last two converter data output from the previous block (via the unit-delay circuit 644) are passed to a mapping table 646 to generate a block of recovered data. Mapping table 646 performs the same function as mapping table 630 of FIG. 6A, except that mapping table 646 performs the mapping on a block-to-block basis. In an alternative embodiment, a time-interleaved ADC is used. In this case, the ADC outputs are already generated as a block at a lower clock frequency and the S/P function is implicit. For instance, a twenty-fold time-interleaved ADC can generate a block of twenty converter output data at a twenty-time lower frequency than the data rate of the serial link. The principle of time-interleaved ADC is well know to those of ordinary skill in the art and thus not described in detail here.

In various embodiments disclosed above, the low-resolution ADC (e.g. ADC 220 of FIG. 2) has M levels, where M is 8 in the exemplary embodiment shown in FIG. 2 but can also be one of the following: 6, 10, 12, 14, and 16. The same principle of applying a low-resolution ADC to detect binary signaling, however, can be extended to a low-resolution ADC with an odd number of levels. For instance, M can also be one of the following: 5, 7, 9, 11, and 13. When M is an even number, there are M/2 levels that are positive, M/2 levels that are negative, one level that is above VREF, and one level that is below VREF. The M levels are then sliced into four levels (e.g. by slicer 280 of FIG. 2): one above VREF, one below VREF, one positive but below VREF, and one negative but above VREF. When M is an odd number, there are (M−1)/2 levels that are positive, (M−1)/2 levels that are negative, one level that is zero, one level that is above VREF, and one level that is below −VREF. In this case, the M levels can no longer be sliced into 4 levels. Instead, the M levels must be sliced into 5 levels: one above VREF, one below −VREF, one positive but below VREF, one negative but above −VREF, and one that is zero. The AGC algorithm described above is still applicable, but the level zero must be regarded as a small signal and thus upon detecting the zero level the gain needs to be increased. The timing detection algorithm described above is also still applicable, but the level zero must be regarded as an ambiguous level and thus the timing error must be set to 0 if either the present sliced data or the previous sliced data is zero. The data recovery algorithms described above are also still applicable, only that the level zero does not have a sign and thus the "sign change" condition does not apply.

Figure 7:
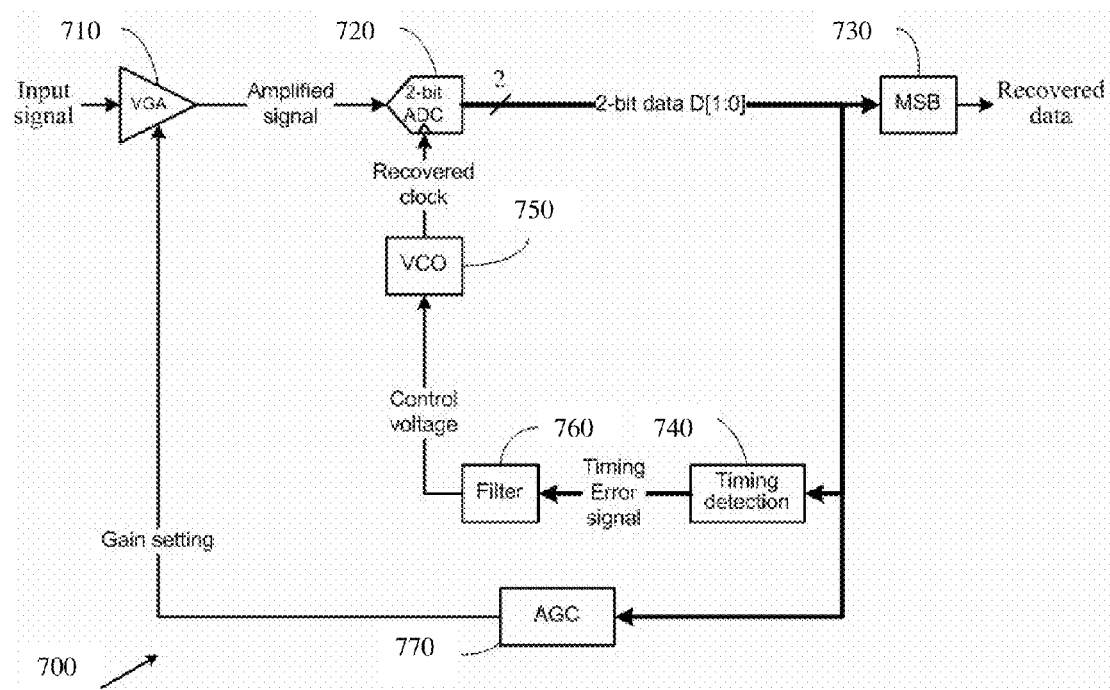
FIG. 7 shows an alternative embodiment of a functional block diagram of a clock-data recovery circuit in accordance with the present invention.

FIG. 7 depicts a functional block diagram of an embodiment 700 of a clock-data recovery (CDR) circuit in accordance with the present invention. CDR circuit 700 comprises: a variable-gain amplifier (VGA) 710 for amplifying an input signal with a gain factor controlled by a gain setting to generate an amplified signal; a 2-bit ADC (analog-digital converter) 720 for converting the amplified signal into 2-bit data D[1:0] in accordance with a timing provided by a recovered clock; a MSB functional block 730 for extracting the most significant bit of the 2-bit data D[1:0] to form the recovered data; a timing detection circuit 740 for processing the 2-bit data D[1:0] to generate a timing error signal; a filter 760 for filtering the timing error signal to generate a control voltage; a VCO (voltage controlled oscillator) 750 for generating the recovered clock under a control of the control voltage; and an AGC (automatic gain control) block 770 for processing the 2-bit data D[1:0] to generate the gain setting to control the gain factor of the VGA 710.

The 2-bit ADC 720 quantizes the amplified signal into 4 levels, say −1.5VREF, −0.5VREF, 0.5VREF, and 1.5VREF, corresponding to the 2-bit data (D[1:0]) values of 00, 01, 10, and 11, respectively. Here, VREF is a reference voltage level to be chosen at the discretion of circuit designer. In an embodiment, the 2-bit quantization is performed in accordance with a mapping scheme illustrated in Table 5.

TABLE 5

| Amplified signal level | 2-bit Data D[1:0] | Quantized level |
| --- | --- | --- |
| Above VREF | 11 | 1.5 · VREF |
| Between 0 V and VREF | 10 | 0.5 · VREF |
| Between −VREF and 0 V | 01 | −0.5 · VREF |
| Below −VREF | 00 | −1.5 · VREF |

Note that in a preferred embodiment VGA 710 and ADC 720 are implemented in a differential circuit topology that the signal level and the quantized level can be negative.

In accordance with an embodiment of the present invention, the gain factor of VGA 710 is adjusted in a closed loop manner so that the absolute value of the amplified signal level has a statistical medium of VREF. In other words, when the amplified signal level is positive, it is equally likely to be above or below VREF; when the amplified signal level is negative, it is equally likely to be above or below VREF. In an embodiment, the gain factor of VGA 710 is adjusted by the AGC block 770 based on the 2-bit data D[1:0] in accordance with a mapping scheme illustrated in Table 6.

TABLE 6

| 2-bit data D[1:0] | Adjustment in the gain factor |
|---|---|
| 11 | Decrease |
| 10 | Increase |
| 01 | Increase |
| 00 | Decrease |

When the 2-bit data D[1:0] is either 00 or 11, the absolute value of the amplified signal level is greater than VREF; the gain factor is apparently too large and needs to be decreased. When the 2-bit data D[1:0] is either 01 or 10, the absolute value of the amplified signal level is less than VREF; the gain factor is apparently too small and needs to be increased. To make the gain adjustment smooth, the amount of incremental change of the gain factor, for either increase or decrease, needs to be moderate. In an embodiment, the amount of incremental change of the gain factor is no more than 5%.

In an embodiment, AGC block 770 doesn't directly apply Table 6 to adjust the gain factor, but instead applies Table 6 to first acquire a sequence of tentative decisions, which are either 1 (for favoring an increase to the gain factor) or −1 (for favoring a decrease to the gain factor), and then filters or processes the tentative decisions to reach a conclusive decision to either increase or decrease the gain factor. In an embodiment, AGC block 770 reaches the conclusive decision based on a majority vote of a block of tentative decisions. By way of example but not limitation, after applying Table 6 to a block of one hundred samples of the 2-bit data D[1:0] to acquire one hundred tentative decisions of either 1 or −1, AGC block 770 will decide to increase the gain factor if there are more than fifty 1's to decrease the gain factor if there are less than fifty 1's and to keep the gain factor unchanged if there are exactly fifty 1's. In an alternative embodiment, AGC block 770 reaches the conclusive decision based on a "landslide" majority vote of a block of tentative decisions. By way of example but not limitation, after applying Table 6 to a block of one hundred samples of the 2-bit data D[1:0] to acquire one hundred tentative decisions of either 1 or −1, AGC block 770 will decide to increase the gain factor if there are more than sixty 1's to decrease the gain factor if there are more than sixty −1's, and to keep the gain factor unchanged otherwise. Of course, the number of "1" and the number of "−1" can be adjusted and different. For example, the number of "1" can be 65 or/and the number of "−1" can be 55. That is, the gain factor is to be adjusted only when there are an overwhelming majority of tentative decisions to suggest a need to either increase or decrease of the gain factor (sixty percentage is considered an overwhelming majority by way of example but not limitation).

In an embodiment, the function of the gain adjustment of AGC 770 can be conditionally disabled (to keep the gain unchanged regardless of the 2-bit data D[1:0]). In an embodiment, the gain adjustment is enabled during a system startup. In an embodiment, the gain adjustment is enabled continually (even though the gain can be updated only once for a certain block of the 2-bit data). In an embodiment, the gain adjustment is enabled intermittently. In an embodiment, the amount of incremental change of the gain factor can be dynamically adjusted. In an embodiment, the amount of incremental change of the gain factor is initially set to a first value and then reduced to a second value that is smaller than the first value; this allows a faster gain adaptation in the initial acquisition phase, and a smoother gain adaptation in the steady state tracking phase.

an embodiment 400 of the timing detection block 770 of FIG. 7 is shown in FIG. 4. Embodiment 400 comprises: a unit delay element 410 for receiving and storing a present 2-bit data sample D[1:0] and outputting a previous 2-bit data sample D1[1:0], and a mapping table 420 for mapping a combination of the present 2-bit data sample D[1:0] and the previous 2-bit data sample D1[1:0] into a timing error signal, which is a ternary signal having three possible values: −1, 0, and 1, in accordance with the above-mentioned algorithm 1: (S1[1:0] is replaced by D1[1:0])

In an embodiment, the filter 760 in FIG. 7 and the filter 260 in FIG. 2 are substantially the same. In an embodiment, the VGA 710 in FIG. 7 and the VGA 210 in FIG. 2 are substantially the same and thus not described in detail here. An embodiment for a voltage controlled oscillator for VCO 750 is well known in prior art and thus not described in detail here. Although a VCO is used here, any alternative controllable oscillator circuit whose oscillating frequency can be controlled by a control signal can be used.

An embodiment for a 2-bit analog-to-digital converter is well known in prior art and thus not described in detail here. In a preferred embodiment, the 2-bit ADC 720 comprises three comparators: one for comparing the amplified signal with −VREF, one for comparing the amplified signal with 0V, and one for comparing the amplified signal with VREF, where VREF, as described earlier, is a reference voltage level where in a steady state of automatic gain control the absolute value of the amplified signal is equally likely to be above or below the reference voltage level.

Figure 8:
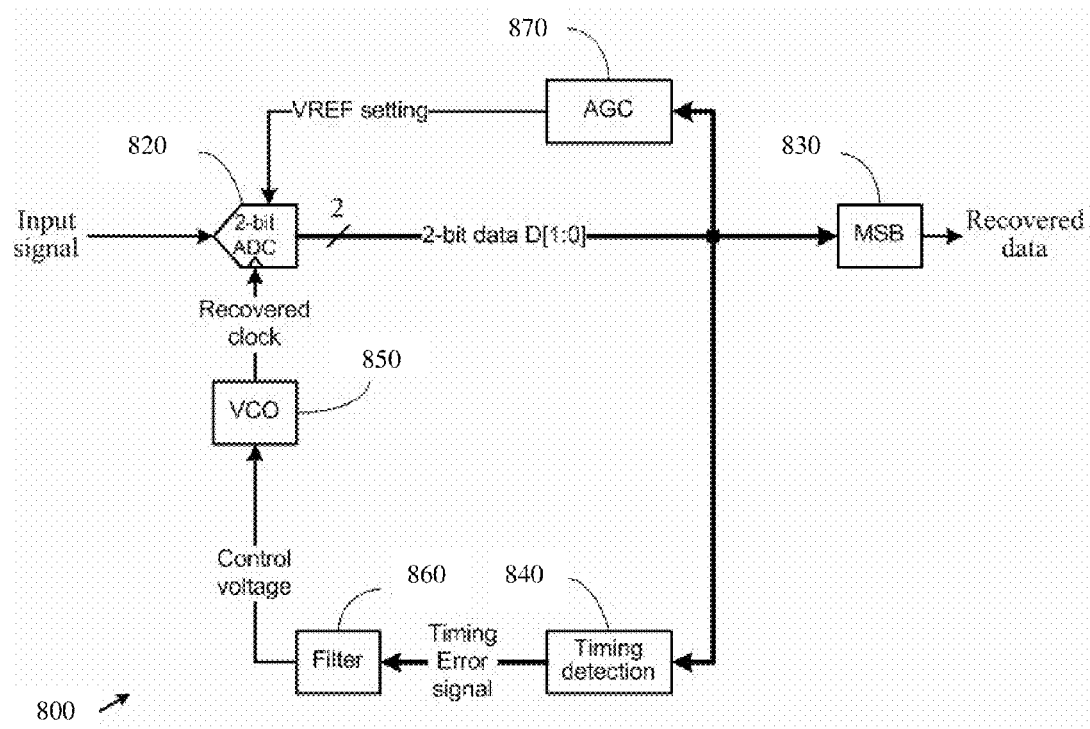
FIG. 8 shows an alternative embodiment of a functional block diagram of a clock-data recovery circuit in accordance with the present invention.

FIG. 8 depicts a functional diagram of an alternative embodiment 800 of a clock-recovery circuit. Embodiment 800 of FIG. 8 is identical with the embodiment 700 of FIG. 7 except for the following changes: (1) there is no variable gain amplifier and the 2-bit ADC 820 directly receives the input signal, and (2) the AGC block 870 controls the VREF level setting instead of the VGA gain setting. An increase/decrease in the gain factor of the variable gain amplifier in embodiment 700 of FIG. 7 is functionally equivalent to a decrease/increase in the reference voltage level VREF for the 2-bit ADC in embodiment 800 of FIG. 8, as the net effects on the outputs of the 2-bit ADC are the same. Embodiment 800 of FIG. 8 does not use a variable gain amplifier, and functionally it is equivalent to using a unity-gain amplifier. AGC block 870 adjusts the reference voltage level VREF so that the absolute value of the input signal is equally likely to be above or below the reference voltage level VREF. Whatever embodiment suitable for the AGC block 770 of FIG. 7 is also suitable for the AGC block 870 of FIG. 8 as long as the direction of adjustment is opposite, i.e. an increase/decrease in gain factor is replaced by a decrease/increase in the reference voltage level VREF.

Those skilled in the art will readily observe that numerous modifications and alterations of the device and method may be made while retaining the teachings of the invention. For example, the device and method according to the invention can be applied in a multi-level signal. Accordingly, the above disclosure should be construed as limited only by the metes and bounds of the appended claims.

The invention claimed is:

1. A clock-data recovery (CDR) circuit comprising:
a variable-gain amplifier (VGA) to amplify an input signal with a gain factor controlled by a gain setting to generate an amplified signal;
an analog-digital converter to convert the amplified signal into a converter output in accordance with a timing provided by a recovered clock, wherein the converter output has N levels;
a timing detection circuit to generate a timing error signal based on the converter output, and in accordance with a logical relationship between sliced data, and a delay of the sliced data;
a filter to filter the timing error signal to generate a control signal;
a controllable oscillator to generate the recovered clock under a control of the control signal;
an automatic gain control (AGC) to set the gain setting to control the gain factor of the VGA based on the converter output; and
a data recovery circuit for generate a recovered data based on the converter output.

2. The CDR circuit of claim 1, further comprising:
a M-level slicer, coupled between the converter and the timing detection circuit, to slice the converter output into the sliced data and output the sliced data to the timing detection circuit.

3. The CDR circuit of claim 2, wherein N includes one of the following: 5, 6, 7, 8, 9, 10, 11, 12, 13, 14, 15, and 16.

4. The CDR circuit of claim 1, wherein one of the N levels corresponds to a voltage level above a reference voltage, one of the N levels corresponds to a voltage level below an inversion of the reference voltage, and the rest of the N levels correspond to voltage levels below the reference voltage but above the inversion of the reference voltage.

5. The CDR circuit of claim 2, wherein the M-level slicer performs the slicing of the converter output into the sliced data in accordance with a comparison between a voltage level corresponding to the converter output and three slicer levels: one corresponding to the reference voltage, one corresponding to a zero voltage, and on corresponding to an inversion of the reference voltage.

6. The CDR circuit of claim 5, wherein the AGC increases the gain factor when the converter output represents a voltage level of a magnitude smaller than the reference voltage, and decreases the gain factor when the converter output represents a voltage level of a magnitude greater than the reference voltage.

7. The CDR circuit of claim 2, wherein the M is smaller than the N.

8. The CDR circuit of claim 1, wherein the timing detection circuit comprises:
a delay circuit to receive the sliced data and output a previous value of the sliced data; and
a mapping table maps the sliced data and the previous value of the sliced data into the timing error signal.

9. The CDR circuit of claim 1, wherein the data recovery circuit comprises a MSB functional circuit.

10. A clock-data recovery (CDR) circuit comprising:
a variable-gain amplifier (VGA) to amplify an input signal with a gain factor controlled by a gain setting to generate an amplified signal;
an analog-digital converter to convert the amplified signal into a converter output in accordance with a timing provided by a recovered clock, wherein the converter output has N levels;
a timing detection circuit to generate a timing error signal based on the converter output;
a filter to filter the timing error signal to generate a control signal;
a controllable oscillator to generate the recovered clock under a control of the control signal;
an automatic gain control (AGC) to set the gain setting to control the gain factor of the VGA based on the converter output; and
a data recovery circuit for generate a recovered data based on the converter output, wherein the data recovery circuit comprises at least a delay circuit and a mapping table, wherein the mapping table is established in accordance with characteristics of an inter-symbol interference within the binary signal.

11. The CDR circuit of claim 10, wherein: the at least one delay circuit receives the converter output and outputs a previous value of the converter output, and the mapping table maps a plurality of inputs, including at least the converter output and the previous value of the converter output, into the recovered data.

12. The CDR circuit of claim 10, wherein: the converter output is mapped into a first logical value when the converter output corresponds to a voltage level close to the reference voltage, into a second logical value when the converter output corresponds to a voltage level close to an inversion of the reference voltage, into the first logical value when the converter output shows an abrupt increase, and into the second logical value when the converter output shows an abrupt decrease.

13. A clock-data recovery method applied to a clock-data recovery circuit, the method comprising:
amplifying an input signal with a gain factor controlled by a gain setting to generate an amplified signal;
quantizing the amplified signal into a converter output in accordance with a timing provided by a recovered clock, wherein the converter output has N levels;
generating a timing error signal the converter output;
filtering the timing error signal to generate a control signal;
controlling a timing of the recovered clock in accordance with the control signal;
controlling the gain setting based on the converter output; and
generating a recovered data based on the converter output, wherein the step of generating the recovered data further comprising:
using at least a delay function to generate a previous value of the converter output, and
using a mapping function to map a plurality of inputs, including at least the converter output and the previous value of the converter output, into the recovered data.

14. The method of claim 13, further comprising:
slicing the converter output into a sliced data, wherein the sliced data have M levels.

15. The method of claim 14, wherein M includes one of the following: 4 and 5, and, N includes one of the following: 5, 6, 7, 8, 9, 10, 11, 12, 13, 14, 15, and 16.

16. The method of claim 13, wherein one of the N levels corresponds to a voltage level above a reference voltage, one of the N levels corresponds to a voltage level below an inversion of the reference voltage, and the rest of the N levels correspond to voltage levels below the reference voltage but above the inversion of the reference voltage.

17. The method of claim 14, wherein the slicing of the converter output into the sliced data is performed in accordance with a comparison between the voltage level corresponding to the low-resolution converter output and three slicer levels: one corresponding to the reference voltage, one corresponding to a zero voltage, and on corresponding to the inversion of the reference voltage.

18. The method of claim 17, wherein the step of controlling the gain setting comprises: increasing the gain factor when the converter output represents a voltage level of a magnitude smaller than the reference voltage, and decreasing the gain factor when the converter output represents a voltage level of a magnitude greater than the reference voltage.

19. The method of claim 13, wherein: the mapping function is established in accordance with characteristics of an intersymbol interference within the binary signal.

20. The method of claim 13, wherein: the converter output is mapped into a first logical value when the converter output corresponds to a voltage level close to the reference voltage, into a second logical value when the converter output corresponds to a voltage level close to an inversion of the reference voltage, into the first logical value when the converter output shows an abrupt increase, and into the second logical value when the converter output shows an abrupt decrease.

* * * * *